United States Patent
Kim et al.

(10) Patent No.: US 9,590,418 B2
(45) Date of Patent: Mar. 7, 2017

(54) APPARATUS FOR CHECKING DAMAGE TO SURGE PROTECTOR AND AUTOMATICALLY CHANGING SURGE PROTECTOR

(71) Applicant: SUNKWANG LIGHTNING PROTECTION TECHNICAL INSTITUTE INC., Seoul (KR)

(72) Inventors: Dong-Jin Kim, Seoul (KR); Jong-Yeon Kim, Gyeonggi-do (KR); Jin-Yeong Lee, Gyeonggi-do (KR); Wan-Seong Kwon, Seoul (KR); Dong-Min Kim, Jeju-do (KR); Yong-Su Kim, Seoul (KR)

(73) Assignee: SUNKWANG LIGHTNING PROTECTION TECHNICAL INSTITUTE INC., Seoul (KR)

( * ) Notice: Subject to any disclaimer, the term of this patent is extended or adjusted under 35 U.S.C. 154(b) by 0 days.

(21) Appl. No.: 15/028,294

(22) PCT Filed: Mar. 10, 2015

(86) PCT No.: PCT/KR2015/002286
§ 371 (c)(1),
(2) Date: Apr. 8, 2016

(87) PCT Pub. No.: WO2015/137692
PCT Pub. Date: Sep. 17, 2015

(65) Prior Publication Data
US 2016/0372919 A1    Dec. 22, 2016

(30) Foreign Application Priority Data
Mar. 13, 2014 (KR) .................. 10-2014-0029720

(51) Int. Cl.
*G08B 21/00* (2006.01)
*H02H 9/04* (2006.01)
(Continued)

(52) U.S. Cl.
CPC ......... *H02H 9/042* (2013.01); *G01R 31/3278* (2013.01); *G08B 5/38* (2013.01); *G08B 21/182* (2013.01); *G09G 1/00* (2013.01)

(58) Field of Classification Search
CPC .................................... G09G 1/00; G01R 1/00
See application file for complete search history.

(56) References Cited

U.S. PATENT DOCUMENTS

| | | | | |
|---|---|---|---|---|
| 2014/0103013 A1* | 4/2014 | Chen | ...................... | H01H 77/02 218/147 |
| 2014/0118102 A1* | 5/2014 | Iwasaki | .................. | H01H 85/32 337/187 |

FOREIGN PATENT DOCUMENTS

| | | |
|---|---|---|
| KR | 1020090013418 | 2/2009 |
| KR | 20120087584 | 8/2012 |

(Continued)

*Primary Examiner* — Shirley Lu
(74) *Attorney, Agent, or Firm* — IPLA P.A.; James E. Bame

(57) ABSTRACT

An apparatus for checking damage to a surge protector and automatically changing a surge protector includes a casing, a current inflow unit supplied with an external current, a current discharge unit configured to supply an inflow current to an external electronic device, surge protectors placed between the current inflow unit and the current discharge unit in parallel, selectively connected to the current inflow unit, and supplied with an electric current, a relay placed between the current inflow unit and the surge protectors and configured to selectively connect the surge protectors to the current inflow unit, and a surge protector damage check unit configured to check whether a surge protector connected to (Continued)

the current inflow unit has been damaged by applying a voltage between the current inflow unit and the current discharge unit.

4 Claims, 2 Drawing Sheets

(51) Int. Cl.
    *G01R 31/327*     (2006.01)
    *G08B 21/18*     (2006.01)
    *G08B 5/38*     (2006.01)
    *G09G 1/00*     (2006.01)

(56) References Cited

FOREIGN PATENT DOCUMENTS

| KR | 101200534 | 11/2012 |
| KR | 101253229 | 4/2013 |
| KR | 101333547 | 12/2013 |

\* cited by examiner

APPARATUS FOR CHECKING DAMAGE TO SURGE PROTECTOR AND AUTOMATICALLY CHANGING SURGE PROTECTOR

BACKGROUND

The present invention relates to an apparatus for checking damage to a surge protector and automatically changing a surge protector, which is capable of preventing damage to an electronic device connected to a surge protector by installing a plurality of surge protectors in parallel and checking damage to a surge protector connected to the apparatus by applying a check voltage to the surge protector.

With the recent development of the data communication technology, the number of electronic devices which are directly connected to external communication lines and transmit and receive data is suddenly increasing. Accordingly, there is a great need for an overvoltage protective device for preventing a failure in an electronic device attributable to the influence of a surge introduced into the electronic device.

A common overvoltage protective device includes a surge protector in order to prevent an overvoltage attributable to a surge from being applied to an electronic device. If a surge continues to be received, however, the surge protector may break down because a varistor within the surge protector is broken. Accordingly, there is a problem in that when the surge protector breaks down, it does not protect an electronic device from a subsequent surge.

In general, the surge protector includes a variety of types of elements, such as a Metal Oxide Varistor (MOV), a Gas Discharge Tube (GDT), a Transient Voltage Suppressor (VTS), and various resistors. The elements of the surge protector are gradually damaged due to inside/outside surges and do not operate at any point of time, thus being unable to normally protect an external electronic device connected to the surge protector. As a result, electronic equipment may be directly damaged by an overvoltage/overcurrent.

That is, when a surge voltage of a protection capacity or higher is inputted to a surge protector, the elements of the surge protector may be damaged and short-circuited. In particular, the TVS or the varistor are most damaged, and the TVS has the highest short-circuit ratio.

However, whether an overvoltage protective device has failed or not cannot be checked with the naked eye. Accordingly, an example in which corresponding equipment is damaged increases because a surge protector is not replaced at an opportune time although the lifespan of the surge protector has expired.

In order to solve such a problem, Korean Patent No. 10-1253229 discloses a technology for detecting the short circuit of one or more of a varistor and a TVS and displaying a result of the detection on the LED of an overvoltage protective device. However, there is still a problem in that equipment is damaged when a surge is inputted to the equipment because whether a failure has occurred in the overvoltage protective device cannot be checked if partial damage not a short circuit is generated.

SUMMARY OF THE INVENTION

An embodiment of the present invention provides an apparatus for checking damage to a surge protector and automatically changing a surge protector, which is capable of preventing damage to an electronic device connected to a surge protector by installing a plurality of surge protectors in parallel and checking damage to a surge protector connected to the apparatus by applying a check voltage to the surge protector.

An embodiment of the present invention provides an apparatus for checking damage to a surge protector and automatically changing a surge protector, which is capable of preventing a lightning current from being inputted to a damaged surge protector when the lightning current is received by applying a check voltage to a surge protector connected to the apparatus and changing the damaged surge protector to another surge protector so that another surge protector operates if damage to the connected surge protector is checked.

An apparatus for checking damage to a surge protector and automatically changing a surge protector according to an embodiment of the present invention includes a casing 100 of a specific shape, a current inflow unit 200 placed within the casing 100 and supplied with an external current, a current discharge unit 300 placed within the casing 100 and configured to supply an inflow current to an electronic device outside the casing 100, a plurality of surge protectors 400 placed between the current inflow unit 200 and the current discharge unit 300 in parallel, selectively connected to the current inflow unit 200, and supplied with an electric current, a relay 500 placed between the current inflow unit 200 and the plurality of surge protectors 400 and configured to selectively connect the surge protectors 400 to the current inflow unit 200, and a surge protector damage check unit 600 configured to check whether a surge protector connected to the current inflow unit 200 has been damaged by supply a voltage between the current inflow unit 200 and the current discharge unit 300. The surge protector damage check unit 600 includes a check voltage application unit 610 connected to the current inflow unit 200 and configured to apply a check voltage, a check voltage detection unit 620 connected to the current discharge unit 300 and configured to detect a voltage passing through the surge protector 400, and a replacement signal generation unit 630 configured to compare the voltage detected by the check voltage detection unit 620 with a reference voltage, generate a replacement signal for a surge protector connected between the current inflow unit 200 and the current discharge unit 300 if, as a result of the comparison, the detected voltage is found to be lower than the reference voltage, and supply the replacement signal to the relay 500.

The apparatus may further include a surge protector connection state display unit 700 configured to display the connection state of the relay 500 so that the connection state is checked outside the casing 100.

The surge protector connection state display unit 700 may include LEDs having the same number as the surge protectors 400, and an LED corresponding to a surge protector connected to the relay 500 may flicker.

The apparatus may further include a management center connection unit 800 configured to provide the connection state of the relay 500 so that the connection state is checked in an external management center.

DETAILED DESCRIPTION OF THE INVENTION

Hereinafter, an apparatus for checking damage to a surge protector and automatically changing a surge protector and an operation thereof according to embodiments of the present invention are described in detail with reference to the accompanying drawings.

Figure 1:
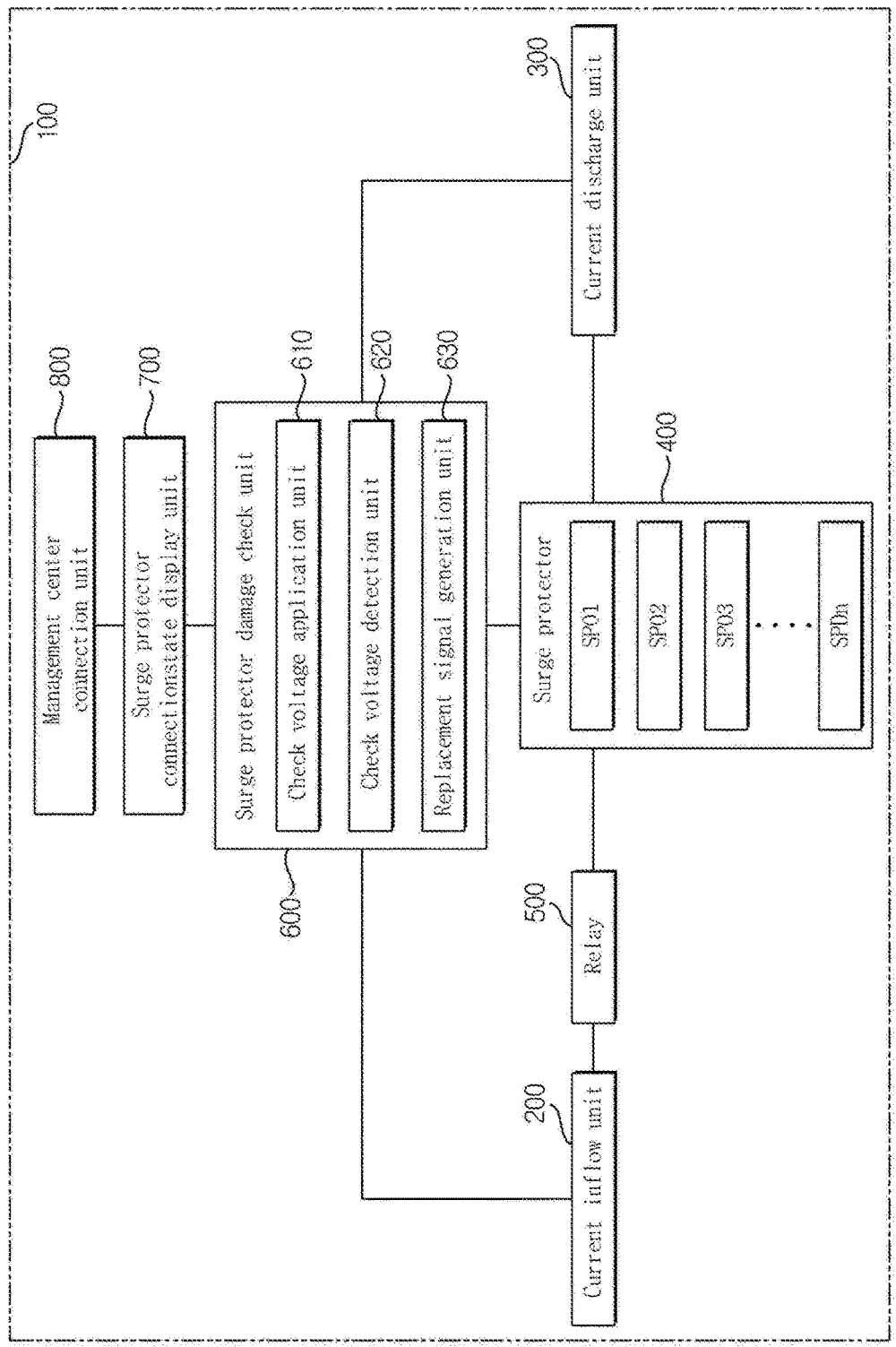
FIG. 1 is a block diagram of an apparatus for checking damage to a surge protector and automatically changing a surge protector according to an embodiment of the present invention.
Figure 2:
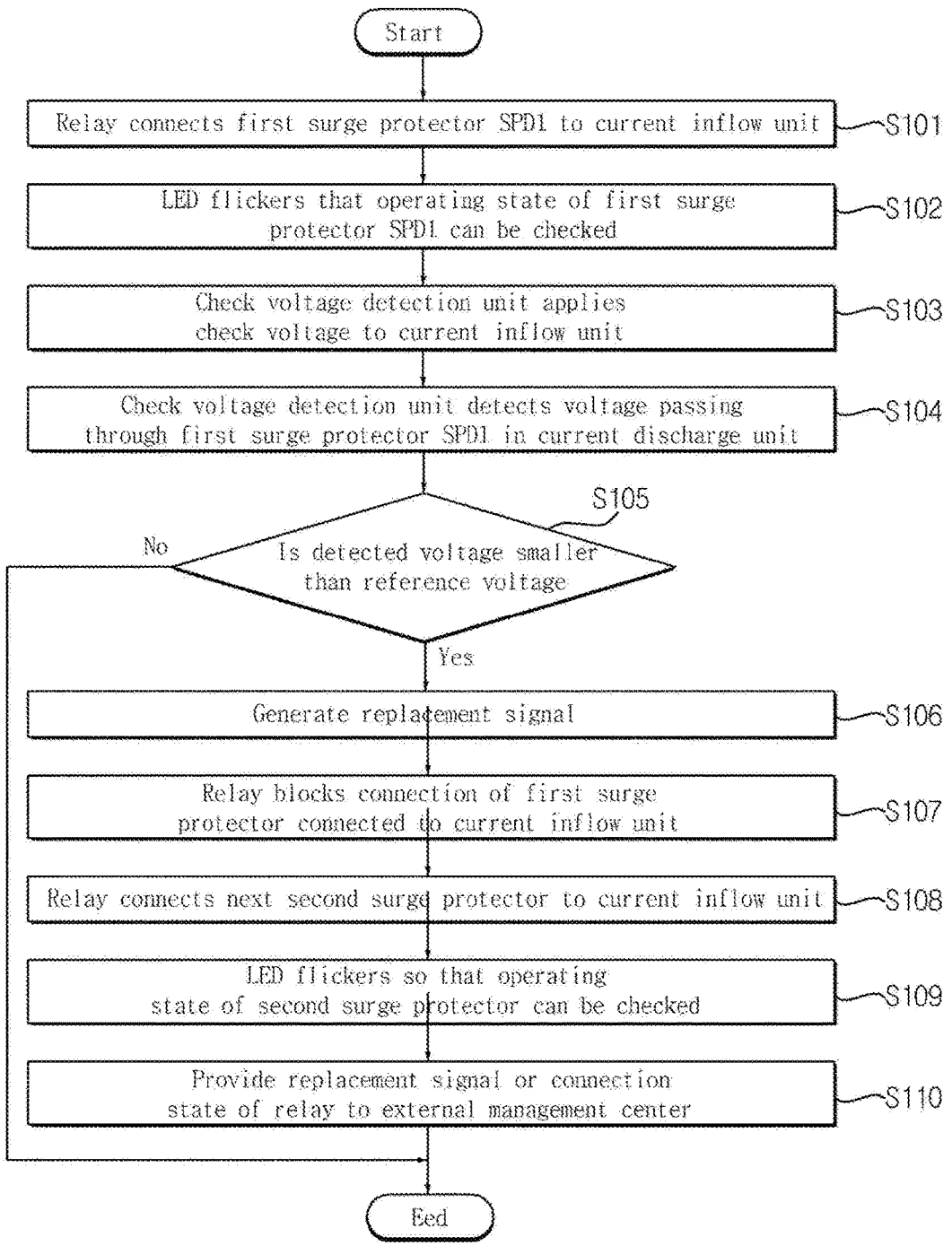
FIG. 2 is a flowchart illustrating an operation of the apparatus for checking damage to a surge protector and automatically changing a surge protector according to an embodiment of the present invention.

As shown in FIGS. 1 and 2, the apparatus for checking damage to a surge protector and automatically changing a surge protector according to an embodiment of the present invention includes a casing 100 of a specific shape. A lightning current is inputted to one side of the apparatus, and an external electronic device is connected to the other side thereof. The casing 100 includes a current inflow unit 200 to which a surge current from the outside is inputted, a current discharge unit 300 configured to discharge an inflow current, a plurality of surge protectors 400 installed in parallel, a relay 500 configured to selectively connect the surge protectors 400 to the current inflow unit 200, a surge protector damage check unit 600 configured to check damage to a specific surge protector connected to the current inflow unit 200, a surge protector connection state display unit 700 configured to check a specific surge protector connected to the relay 500, and a management center connection unit 800.

The current inflow unit 200 is placed within the casing 100 and supplied with an electric current introduced from the outside.

The current discharge unit 300 is connected to an electronic device and placed within the casing 100. The current discharge unit 300 supplies an inflow current to an electronic device outside the casing 100.

The plurality of surge protectors 400 is placed between the current inflow unit 200 and the current discharge unit 300 in parallel. The plurality of surge protectors 400 is selectively connected to the current inflow unit 200 and supplied with an electric current. The surge protectors 400 include an input stage and an output stage for discharging an electric current to the current discharge unit 300. When the surge protector is connected to the relay 500, it is connected to the current inflow unit 200. The surge protectors 400 include a first surge protector SPD1, a second surge protector SPD2, a third surge protector SPD3, . . . , an n-th surge protector SPDn that are formed in parallel. When the first surge protector SPD1 connected to the relay 500 is damaged, the relay 500 is connected to one of the second surge protector SPD2, the third surge protector SPD3, . . . , the n-th surge protector SPDn, being capable of supplying with the current of the current inflow unit 200.

The relay 500 is placed between the current inflow unit 200 and the surge protectors 400 and selectively connects the plurality of surge protectors 400 to the current inflow unit 200. When a replacement signal for a specific surge protector is received from the surge protector damage check unit 600, the relay 500 blocks the connection of the specific surge protector and connects a new surge protector to the current inflow unit 200.

The surge protector damage check unit 600 checks whether a specific surge protector connected to the current inflow unit 200 has been damaged by applying a voltage between the current inflow unit 200 and the current discharge unit 300. The surge protector damage check unit 600 includes a check voltage application unit 610, a check voltage detection unit 620, and a replacement signal generation unit 630.

The check voltage application unit 610 is connected to the current inflow unit 200 and applies a specific check voltage. The check voltage detection unit 620 is connected to the current discharge unit 300 and detects a voltage passing through a specific surge protector.

A voltage in a specific surge protector connected to the current inflow unit 200 and the current discharge unit 300 can be checked through the check voltage application unit 610 and the check voltage detection unit 620.

The replacement signal generation unit 630 compares a voltage, detected by the check voltage detection unit 620, with a reference voltage. If, as a result of the comparison, the detected voltage is found to be lower than the reference voltage, the replacement signal generation unit 630 generates a replacement signal for a corresponding surge protector connected between the current inflow unit 200 and the current discharge unit 300 and supplies the replacement signal to the relay 500.

The surge protector connection state display unit 700 is placed outside the casing 100 and displays the connection state of the relay 500 so that it may be checked outside. For example, the surge protector connection state display unit 700 turns on and off LEDs having the same number as the surge protectors 400. At this time, the surge protector connection state display unit 700 may display blue when the relay 500 is connected and may display red when the relay 500 is not connected.

The management center connection unit 800 is provided so that the surge protector damage check unit 600 generates a replacement signal or the connection state of the relay 500 is checked in an external management center. A damaged surge protector can be rapidly replaced in the management center based on data transmitted by the management center connection unit 800.

An operation of the apparatus for checking damage to a surge protector and automatically changing a surge protector according to an embodiment of the present invention is described in detail below with reference to FIG. 2.

The casing 100 of the apparatus for checking damage to a surge protector and automatically changing a surge protector includes the current inflow unit 200 to which an external surge current is inputted, the current discharge unit 300 configured to discharge an inflow current, the plurality of surge protectors 400 installed in parallel, the relay 500 configured to selectively connect the surge protectors 400 to the current inflow unit 200, and the surge protector damage check unit 600 configured to check damage to a specific surge protector connected to the current inflow unit 200.

A plurality of the surge protectors 400, for example, the first surge protector SPD1, the second surge protector SPD2, the third surge protector SPD3, . . . , the n-th surge protect SPDn are mounted on the casing 100. First, the relay 500 connects the first surge protector SPD1 to the current inflow unit 200 at step S101. In this case, a blue LED corresponding to the first surge protector SPD1 flickers and LEDs corresponding to the remaining surge protectors are turned off on the surge protector connection state display unit 700 outside the casing 100 so that the operating state of the first surge protector SPD1 can be checked at step S102.

If the surge protector damage check unit 600 checks the operating state of the first surge protector SPD1 connected to the current inflow unit 200 and the current discharge unit 300, the check voltage application unit 610 of the surge protector damage check unit 600 applies a check voltage to the current inflow unit 200 at step S103. The check voltage detection unit 620 detects a voltage passing through the first surge protector SPD1 in the current discharge unit 300 at step S104. The voltage of the first surge protector SPD1 connected to the current inflow unit 200 and the current discharge unit 300, in the current discharge unit 300, can be checked through the check voltage application unit 610 and the check voltage detection unit 620.

When the voltage is detected by the check voltage detection unit 620, the replacement signal generation unit 630 compares the detected voltage with a reference voltage at step S105. If, as a result of the comparison, the detected voltage is found to be lower than the reference voltage, the replacement signal generation unit 630 generates a replacement signal for the first surge protector SPD1 and supplies it to the relay 500 at step S106.

In response to the replacement signal, the relay 500 blocks the connection of the first surge protector SPD1 connected to the current inflow unit 200 at step S107 and connects a next surge protector, that is, the second surge protector SPD2, to the current inflow unit 200 at step S108. In this case, a blue LED corresponding to the second surge protector SPD2 flickers on the surge protector connection state display unit 700 outside the casing 100 so that the operating state of the second surge protector SPD2 can be checked at step S109.

Furthermore, the management center connection unit 800 provides the replacement signal or the connection state of the relay 500 so that the replacement signal or the connection state can be checked in an external management center at step S110. Accordingly, the management center connection unit 800 can replace the damaged first surge protector SPD1.

The apparatus for checking damage to a surge protector and automatically changing a surge protector according to an embodiment of the present invention has an advantage in that damage to an electronic device connected to a surge protector can be prevented because damage to the connected surge protector can be checked using a check voltage in the state in which a plurality of the surge protectors has been installed in parallel.

Furthermore, there is an advantage in that the inflow of a lightning current into a damaged surge protector can be prevented when the lightning current is received because a connection state is changed so that another surge protector operates when the damaged surge protector is checked based on a check voltage.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for checking damage to a surge protector and automatically changing a surge protector, comprising:
    a casing of a specific shape;
    a current inflow unit placed within the casing and supplied with an external current;
    a current discharge unit placed within the casing and configured to supply an inflow current to an electronic device outside the casing;
    a plurality of surge protectors placed between the current inflow unit and the current discharge unit in parallel, selectively connected to the current inflow unit, and supplied with an electric current;
    a relay placed between the current inflow unit and the plurality of surge protectors and configured to selectively connect the surge protectors to the current inflow unit; and
    a surge protector damage check unit configured to check whether a surge protector connected to the current inflow unit has been damaged by supply a voltage between the current inflow unit and the current discharge unit,
    wherein the surge protector damage check unit comprises:
    a check voltage application unit connected to the current inflow unit and configured to apply a check voltage,
    a check voltage detection unit connected to the current discharge unit and configured to detect a voltage passing through the surge protector, and
    a replacement signal generation unit configured to compare the voltage detected by the check voltage detection unit with a reference voltage, generate a replacement signal for a surge protector connected between the current inflow unit and the current discharge unit if, as a result of the comparison, the detected voltage is found to be lower than the reference voltage, and supply the replacement signal to the relay 500.

2. The apparatus of claim 1, further comprising a surge protector connection state display unit configured to display a connection state of the relay so that the connection state is checked outside the casing.

3. The apparatus of claim 2, wherein:
    the surge protector connection state display unit comprises LEDs having a number identical with a number of the surge protectors, and
    an LED corresponding to a surge protector connected to the relay flickers.

4. The apparatus of claim 1, further comprising a management center connection unit configured to provide a connection state of the relay so that the connection state is checked in an external management center.

* * * * *